United States Patent [19]

Aoshima et al.

[11] Patent Number: 4,864,220
[45] Date of Patent: Sep. 5, 1989

[54] VOLTAGE DETECTOR USING ELECTRO-OPTIC MATERIAL AND INTERFERENCE OF LIGHT BEAMS

[75] Inventors: Shinichiro Aoshima; Yutaka Tsuchiya; Takuya Nakamura, all of Shizuoka, Japan

[73] Assignee: Hamamatsu Photonics Kabushiki Kaisha, Shizuoka, Japan

[21] Appl. No.: 217,793

[22] Filed: Jul. 12, 1988

[30] Foreign Application Priority Data

Jul. 13, 1987 [JP] Japan ............ 62-174531

[51] Int. Cl.$^4$ ............ G01R 31/00; G01R 29/12; G01B 9/02
[52] U.S. Cl. ............ 324/96; 250/227; 350/356; 356/345
[58] Field of Search ............ 324/96, 117 R; 350/356, 350/374, 376; 356/345, 361, 368; 250/227

[56] References Cited

U.S. PATENT DOCUMENTS

| | | | |
|---|---|---|---|
| 4,446,425 | 5/1984 | Valdmanis et al. | 324/77 K |
| 4,533,829 | 8/1985 | Miceli et al. | 250/227 |
| 4,603,293 | 7/1986 | Mourou et al. | 324/96 |
| 4,618,819 | 10/1986 | Mourou et al. | 324/77 K |

FOREIGN PATENT DOCUMENTS

| | | | |
|---|---|---|---|
| 0197196 | 10/1986 | European Pat. Off. | |
| 2123546 | 2/1984 | United Kingdom | 324/96 |

OTHER PUBLICATIONS

Valdmanis, J. A. et al., "Subpicosecond Electrooptic Sampling: Principles and Applications", IEEE Journal of Quantum Electronics, vol. qe-22, No. 1, pp. 69-78, Jan. 1986.

Valdmanis, J. A. et al., "Picosecond Electrooptic Sampling System", Appl. Phys. Lett., vol. 41, No. 3, pp. 211-212, Aug. 1982.

Valdmanis, J. A. et al., "Subpicosecond Electrical Sampling", IEEE Journal of Quantum Electronics, vol. qe-19, No. 4, pp. 664-667, Apr. 1983.

Kolner, B. H. et al., "Electro-Optic Sampling With Picosecond Resolution", Electronics Letters, vol. 19, No. 15, pp. 574-575, Jul. 1983.

Tsuchiya, Y., "Advances in Streak Camera Instrumentation for the Study of Biological and Physical Processes", IEEE Journal of Quantum Electronics, vol. qe-20, No. 12, pp. 1516-1528, Dec. 1984.

Valdmanis, J. A., "High-Speed Optical Electronics: The Picosecond Optical Oscilloscope", Solid State Technology/Test and Measurement World, pp. S40-S44, Nov. 1986.

Valdmanis, J. A. et al., "Electro-Optic Sampling: Testing Picosecond Electronics Part 1, Principles and Embodiments", Laser Focus/Electro-Optics, pp. 84-96, Feb. 1986.

Valdmanis, J. A. et al., "Electro-Optic Sampling: Testing Picosecond Electronics Part 2, Applications", Laser Focus/Electro-Optics, pp. 96-106, Mar. 1986.

Valdmanis, J. A. et al., "Subpicosecond Electrical Sampling and Applications", Picosecond Optoelectronic Devices, pp. 249-270, 1984.

Williamson, S. et al., "Picosecond Electro-Electron Optic Oscilloscope", Proc. Conf. Picosecond Electron, Optoelectron, pp. 58-61, (N.Y. Springer-Verlag), 1985.

Kolner, B. H. et al., "Electrooptic Sampling in GaAs Intergrated Circuits", IEEE Journal of Quantum Electronics, vol. qe-22, pp. 79-93, Jan. 1987.

Nees, J. et al., "Noncontact Electro-Optic Sampling With A GaAs Injection Laser", Electronics Letters, vol. 22, No. 17, pp. 918-919, Aug. 1986.

Primary Examiner—Ernest F. Karlsen
Attorney, Agent, or Firm—Finnegan, Henderson, Farabow, Garrett & Dunner

[57] ABSTRACT

In a voltage detector using an electro-optic material whose refractive index is changed by a voltage developing in a selected area of an object under test, a light beam emitted from a light source is applied to a beam splitter, where it is split into a light beam advancing along a reference optical path and a light beam advancing along an optical path extended to an optical path length changing means made of the electro-optic material, and the light beams are returned from the reference optical path and the optical path length changing means after reflection to the beam splitter, where they are caused to interference with each other to provide an output light beam which is applied to a detector. The efficiency of light beam utilization is improved, and the voltage developing in the selected area of the object can be detected with high accuracy.

10 Claims, 4 Drawing Sheets

VOLTAGE DETECTOR USING ELECTRO-OPTIC MATERIAL AND INTERFERENCE OF LIGHT BEAMS

BACKGROUND OF THE INVENTION

The present invention relates to a voltage detector for detecting the voltage developing in a selected area of an object to be measured such as an electric circuit. In particular, the present invention relates to a voltage detector of the type that detects voltage by making use of the change in light polarization that occurs in accordance with the voltage developing in a selected area of an object to be measured.

Various voltage detectors have been used to detect the voltage developing in a selected area of objects to be measured such as electric circuits. Conventional voltage detectors are roughly divided into two types: in one type, the probe is brought into contact with a selected area of an object to be measured and the voltage developing in that area is detected; and in the other type, the probe does not make contact with a selected area of an object to be measured and instead an electron beam is launched into that area and the voltage developing in it is detected.

Voltage changes rapidly in fine-line portions of objects such as integrated circuits that are small and complicated in structure, and a strong demand exists in the art for detecting such rapidly changing voltage with high precision without affecting the condition of the fine-line portions. However, this need has not been fully met by the prior art voltage detectors. With devices of the type that detects voltage by bringing the probe into contact with a selected area of an object to be measured, it is difficult to attain direct contact between the probe and a fine-line portion of the object of interest such as an integrated circuit. Even if this is successfully done, it has been difficult to correctly analyze the operation of the integrated circuit solely on the basis of the voltage information picked up by the probe. A further problem involved is that contact by the probe can cause a change in the operation of the integrated circuit. Voltage detectors of the type that employs an electron beam has the advantage that they are capable of voltage detection without bringing the probe into contact with an object to be measured. However, the area to be measured with such voltage detectors has to be placed in vacuum and its surface must be exposed at that. In addition, the area to be measured is prone to be damaged by the electron beam.

The prior art voltage detectors have a common problem in that they are unable to operate quickly enough to follow rapid changes in voltage and hence fail to achieve precise detection of voltages that change rapidly as in integrated circuits.

With a view to solving these problems, it has been proposed by two of the present inventors (Japanese Patent Application No. 137317/1987 filed on May 30, 1987) that voltage be detected by making use of the polarization of a light beam that changes with the voltage developing in a selected area of an object to be measured.

A voltage detector operating on this principle is schematically shown in FIG. 6. The detector generally indicated by 50 is composed of the following components: an optical probe 52; a CW (Continuous-Wave) light source 53 typically in the form of a laser diode; an optical fiber 51 for guiding a light beam from the CW light source 53 into an optical probe 52 through a condenser lens 60; an optical fiber 92 for guiding reference light from the optical probe 52 into a photoelectric converter 55 through a collimator 90; an optical fiber 93 for guiding output light from the optical probe 52 into a photoelectric converter 58 through a collimator 91; and a comparator circuit 61 for comparing the electric signals form the photoelectric converters 55 and 58.

The optical probe 52 is equipped with an electro-optic material 62 such as an optically uniaxial crystal of lithium tantalate ($LiTaO_3$). The tip 63 of the electro-optic material 62 is worked into a frustoconical shape. The optical probe 52 is surrounded with a conductive electrode 64 and has at its tip 63 a coating of reflecting mirror 65 in the form of a thin metal film or a multilayered dielectric film.

The optical probe 52 further includes the following components: a collimator 94; condenser lenses 95 and 96; a polarizer 54 for selectively extracting a light beam having a predetermined polarized component from the light beam passing through the collimator 94; and a beam splitter 56 that splits the extracted light beam from the polarizer 54 into reference light and input light to be launched into the electro-optic material 62 and which allows the output light emerging from the electro-optic material 62 to be directed into an analyzer 57. The reference light is passed through the condenser lens 95 and thence launched into the optical fiber 92, whereas the output light emerging from the electro-optic material 62 is passed through the condenser lens 96 and thence launched into the optical fiber 93.

Voltage detection with the system shown in FIG. 3 starts with connecting the conductive electrode 64 on the circumference of the optical probe 52 to a predetermined potential, say, the ground potential. Then, the tip 63 of the probe 52 is brought close to the object to be measured such as an integrated circuit (not shown), whereupon a change occurs in the refractive index of the tip 63 of the electro-optic material 62 in the probe 52. Stated more specifically, the difference between refractive indices for an ordinary ray and an extraordinary ray in a plane perpendicular to the light-traveling direction will change in the optically uniaxial crystal.

The light beam issuing from the light source 53 passes through the condenser lens 60 and is guided through the optical fiber 51 to be directed into the collimator 94 in the optical probe 52. The light beam is polarized by the polarizer 54 and a predetermined polarized light having intensity I is launched into the electro-optic material 62 in the optical probe 52 through the beam splitter 56. Each of the reference light and the input light, which are produced by passage through the beam splitter 56, has an intensity of I/2. As already mentioned, the refractive index of the tip 63 of the electro-optic material 62 varies with the voltage on the object being measured, so the input light launched into the electro-optic material 62 will experience a change in the state of its polarization at the tip 63 in accordance with the change in the refractive index of the latter. The input light is then reflected from the reflecting mirror 65 and makes a return trip through the electro-optic material 62, from which it emerges and travels back to the beam splitter 56. If the length of the tip 63 of the electro-optic material 62 is written as l, the state of polarization of input light launched into that material will change in proportion to the difference between refractive indices for the ordinary ray and the extraordinary ray and to the length 21 as well. The output light sent back into the beam splitter 56 is thence directed into the analyzer 57. The intensity of the output light entering the analyzer 57 has been decreased to I/4 as a result of splitting with the beam splitter 56. If the analyzer 57 is designed in such a way as to transmit only a light beam having a polarized component perpendicular to that extracted by the polarizer 54, the intensity of output light that is fed into the analyzer 57 after experiencing a change in the state of its polarization is changed from I/4 to (I/4) $\sin^2[(\pi/2)V/V_0]$ in the analyzer 57 before it is further fed into the photoelectric converter 58. In the formula expressing the intensity of output light emerging from the analyzer 57, V and $V_0$ is a half-wave voltage. is the voltage developing in the object to be measured, In the comparator circuit 61, the intensity of reference light produced from the photoelectric converter 55, or I/2, is compared with the intensity of output light produced from the other photoelectric converter 58, or (I/4) $\sin^2[(\pi/2)V/V_0]$.

The intensity of output light, or (I/4) $\sin^2[(\pi/2)V/V_0]$, will vary with the change in the refractive index of the tip 63 of the electro-optic material 62 that occurs as a result of the change in voltage. Therefore, this intensity can be used as a basis for detecting the voltage developing in a selected area of the object to be measured, say, an integrated circuit.

As described above, in using the voltage detector 50 shown in FIG. 6, the tip 63 of the optical probe 52 is brought close to the object to be measured and the resulting change in the refractive index of the tip 63 of the electro-optic material 62 is used as a basis for detecting the voltage developing in a selected area of the object of interest. Therefore, the voltage developing in fine-line portions of a small and complicated object such as an integrated circuit which are difficult to be contacted by a probe or which cannot be contacted by the same without affecting the voltage being measured can be effectively detected by the detector 50 without bringing the optical probe 52 into contact with such fine-line portions.

As was described above, with the voltage detector 50 shown in FIG. 6, the voltage developing in the selected area of the object is measured by utilizing the variation in polarization of the light beam in the electro-optic material 62. Therefore, it is essential for the polarizer 54 to extract only the light beam having the predetermined linear polarization component from the light beam emitted from the light source 53, and for the analyzer 57 to extract the predetermined linear polarization component from the output light beam from the electro-optic material 62. Accordingly, the efficiency of light beam utilization in the foregoing voltage detector is not enough.

SUMMARY OF THE INVENTION

Accordingly, an object of this invention is to provide a voltage detector which is simple in the arrangement of the optical system and has high efficiency of light beam utilization, and which can detect with high accuracy a voltage developing in a selected area of an object under measurement.

The foregoing object and other objects of the invention have been achieved by the provision of a voltage detector using an electro-optic material whose refractive index is changed by the voltage developing in the selected area of the object under measurement, which, according to the invention, comprises: a light source for emitting a light beam; optical path length changing means made of the electro-optic material, for changing the effective optical path length of the light beam corresponding to a refractive index of the electro-optic material; splitting means for splitting the light beam from the light source into a light beam advancing along a reference optical path and a light beam advancing along an optical path extended to the optical path length changing means, and causing a reflected light beam from the reference optical path and a reflected light beam from the optical path length changing means to interfere with each other to provide an output interference light beam; and guide means for applying the output interference light beam provided by the splitting means to detection means.

In the voltage detector of the invention, the light beam from the light source is applied to the splitting means, where it is split into the light beam advancing along the reference optical path and the light beam advancing along the optical path extended to the optical path length changing means made of the electro-optic material. The return light beams from the reference optical path and the optical path length changing means are applied to the splitting means, where they are caused to interfere with each other to provide the output light beam. In this case, the effective optical path length of the light beam reflected from the optical path length changing means is changed, because the refractive index of the optical path length changing means is varied by the voltage developing in the selected area of the object. If the effective length of the reference optical path is constant, then the intensity of the output light beam changes with the voltage. Therefore, the voltage provided at the predetermined part of the object can be measured by detecting the intensity of the output interference light beam with the detection means.

The nature, principle and utility of the invention will become more apparent from the following detailed description when read in conjunction with the accompanying drawings, in which like parts are designated by like reference numerals or characters.

DETAILED DESCRIPTION OF THE PREFERRED EMBODIMENTS

Preferred embodiments of this invention will be described with reference to the accompanying drawings.

Figure 1:
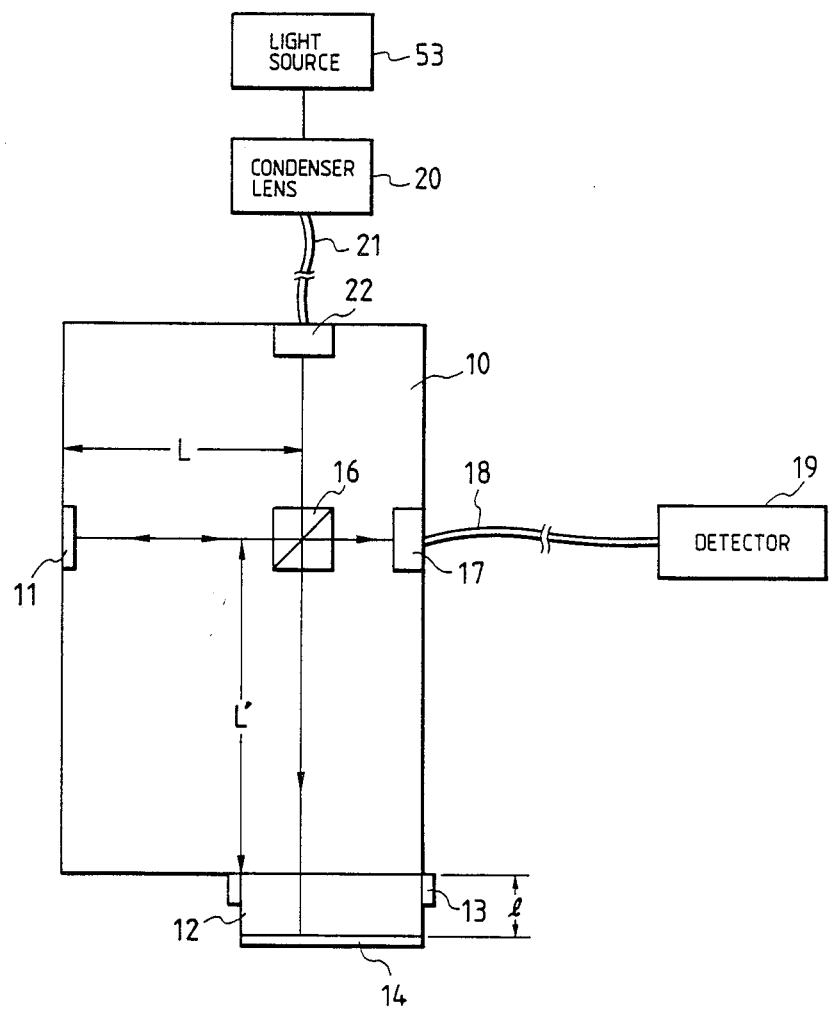
FIG. 1 is an explanatory diagram showing the arrangement of the first embodiment of a voltage detector according to this invention.

The first embodiment of a voltage detector of the invention, as shown in FIG. 1, comprises: an optical probe 10; an electro-optic material 12 formed on the bottom wall of the optical probe 10; an electrically conductive electrode 13 on a peripheral side wall of the electro-optic material 12; and a reflection mirror 14 is formed on the end face of the electro-optic material 12. The reflection mirror 14 is made of a metal or a multilayered dielectric film.

A beam splitter 16 is provided inside the optical probe 10. The beam splitter 16 splits a light beam from a light source 53 into a light beam advancing to a reflection mirror 11 and a light beam going to the electro-optic material 12, causes a reflected light beam from the electro-optic material 12 to interfere with a light beam reflected from the reflection mirror 11, and outputs the resultant light beam after splitting. The output light beam from the beam splitter 16 is applied through a condenser lens 17 and an optical fiber 18 to a detector 19.

More specifically, in the voltage detector thus constructed, the light beam emitted by the light source 53 is applied through a condenser lens 20, an optical fiber 21 and a collimator 22 to the beam splitter 16, where it is split into the light beam going to the reflection mirror 11 and the light beam going to the electro-optic material 12. The light beam reflected from the reflection mirror 11, and the light beam reflected from the reflection mirror 14 after passing through the electro-optic material 12 are returned to the beam splitter 16, where they are caused to interfere with each other to provide the output light beam, which is applied through the condenser lens 17 and the optical fiber 18 to the detector 19.

The refractive index of the electro-optic material 12 is changed by a voltage developed in a selected area of an object under test, as a result of which the effective optical path length in the electro-optic material 12 is changed. If the thickness of the electro-optic material 12 in the light-traveling direction is represented by $l$, and the refractive index of the electro-optic material 12 to which no voltage is applied is represented by $n_0$, then the effective "go and return" optical path length is $2ln_0$. If the refractive index of the electro-optic material 12 to which a voltage is applied is represented by $n$, then the effective "go and return" optical path length is $2ln$. Therefore, the difference between the effective "go and return" optical path length provided when no voltage is applied to the electro-optic material 12 and that provided when the voltage is applied to the electro-optic material 12 (hereinafter referred to as "an optical path length difference", when applicable) is:

$$2l|n-n_0|. \quad (1)$$

Figure 2:
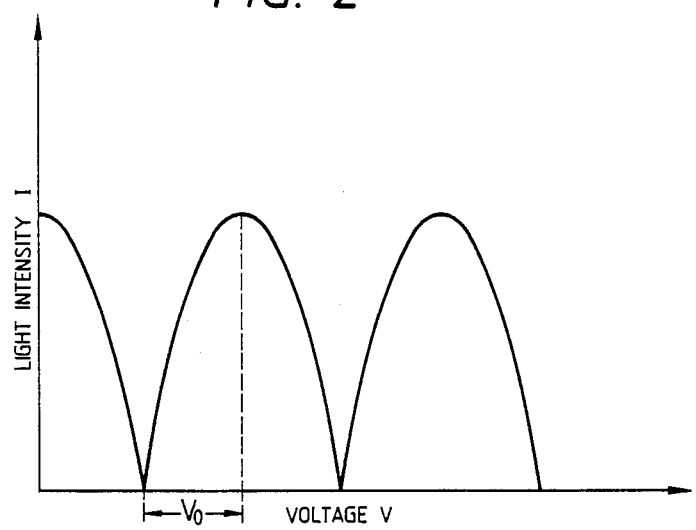
FIG. 2 is a graphical representation indicating the dependence of output light intensity on a voltage for a description of the operation of the voltage detector shown in FIG. 1.

As was described above, the effective optical path length of the light beam in the electro-optic material 12 is affected by the voltage applied to the latter 12. Therefore, the light intensity I of the output light beam provided through the interference of the light beam reflected from the electro-optic material 12 and the light beam reflected from the reflection mirror 11 is changed by the voltage applied to the electro-optic material 12 as shown in FIG. 2. That is, the output light intensity I is:

$$I \propto \cos^2[(\pi/2)(V/V_0)+\phi] \quad (2)$$

where $V_0$ is a half-wave voltage; V is the voltage to be measured, and $\phi$ is a phase difference provided when no voltage is applied to the electro-optic material; namely, an initial phase difference which is represented by the following equation (3):

$$\phi = 2\pi c \cdot \Delta L/\lambda \quad (3)$$

where c is the velocity of light; $\Delta L$ is a relative optical path difference, and $\lambda$ is a wavelength. The relative optical path difference $\Delta L$ is:

$$\Delta L = 2 \cdot |L - |(L'30\ n_0 \cdot l)||$$

where L is an optical distance between the beam splitter 16 and the reflection mirror 11, and L' is an optical distance between the beam splitter 16 and the electro-optic material 12.

The initial phase difference $\phi$ may be controlled by a mechanism in which a micrometer is provided to move the reflection mirror 11 thereby to change the optical distance L between the reflection mirror 11 and the beam splitter 16.

Thus, the light intensity of the light beam passed through the condenser lens 17 is detected in this manner, so that the voltage developing in the selected area of the object under test is detected.

In the above-described voltage detector, the following method may be employed: Another beam splitter (not shown) for extracting a reference light beam from the light beam emitted from the light source 53 is provided between the collimator 22 and the beam splitter 16, and the intensity of the reference light beam from the beam splitter is compared with that of the output light beam from the optical fiber 18 by a comparator circuit (not shown), so that the intensity of the output light beam is prevented from being affected by the fluctuation in intensity of the light beam emitted from the light source 53, so that the voltage can be detected more accurately.

As was described above, in the above-described embodiment of the invention, the voltage developing in the selected area of the object under test is measured by utilizing the fact that the voltage affects the effective optical path length of the light beam in the electro-optic material thereby to change the light intensity of the output light beam outputted from the condenser lens 17 which has been subjected to optical interference.

Thus, in the above-described voltage detector, although the beam splitter 16 is employed, as the predetermined linear polarization component is not extracted from the light beam, the efficiency of the light beam utilization is greatly increased. Furthermore, as the detector 19 only detects the light intensity, the light beam having been subjected to the optical interference can be guided to the detector 19 by means of only one optical fiber 18. Thus, the voltage detector of the invention can detect voltages with high accuracy, being considerably simple in construction.

Figure 3:
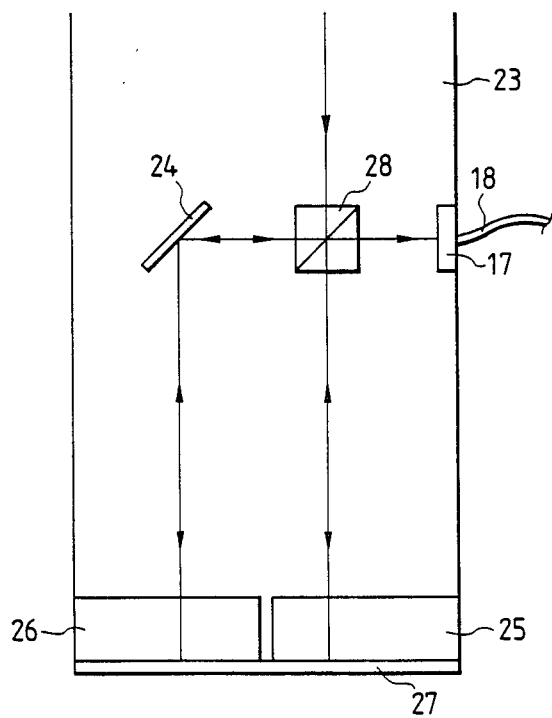
FIG. 3 is an explanatory diagram showing the arrangement of the second embodiment of the voltage detector according to the invention.

The second embodiment of the voltage detector according to the invention, as shown in FIG. 3, comprises an optical probe 23 including: the first electro-optic material 25 which is increased in refractive index when applied with voltage; the second electro-optic material 26 which is decreased in refractive index when applied with voltage, the first and second electro-optic materials 25 and 26 being provided inside the optical probe 23; a reflection mirror 27 made of a metal or a multilayered dielectric film, disposed on the outer surfaces of the first and second electro-optic materials 25 and 26; and a beam splitter 28 arranged inside the optical probe 23. The beam splitter 28 acts to split an incident light beam into a light beam going to the first electro-optic material 25 and a light beam going to the second electro-optic material 26, and causes the return light beam from the first electro-optic material 25 and the return light beam from the second electro-optic material 26 to interfere with each other and outputs the resultant output light beam after splitting. The light beam going to the second electro-optic material 26 from the beam splitter is applied to the second electro-optic material 26 through a reflection mirror 24.

In the voltage detector thus constructed, similarly as in the case of the first embodiment of the voltage detector shown in FIG. 1, the voltage developing in a selected area of the object under measurement can be detected by utilizing the fact that when the return light beam from the first electro-optic material 25 and the return light beam from the second electro-optic material 25 interfere with each other, the light intensity of the resultant output light beam is affected by the voltage applied to the first and second electro-optic materials 25 and 26.

In the second embodiment of the voltage detector according to the invention, the electro-optic materials 25 and 26 employed are opposite in refractive index change to each other when applied with voltage. Therefore, the change in the light intensity which is caused as a result of the optical interference is greater than that in the first embodiment of the voltage detector; that is, the second embodiment is higher in sensitivity than the first embodiment.

In the first and second embodiments of the voltage detector, parts of the reflected light beams which have returned to the beam splitter (16 or 18) will advance to the light source 53 to adversely affect the stability of the latter 53. This difficulty can be eliminated by the following method: An optical isolator (not shown) is interposed between the collimator 22 and the beam splitter 16 (or 28) so that no light beam is returned to the collimator 22 or the light source 53 from the beam splitter 16 (or 28). In addition, anti-reflection films may be coated on light-incidence surfaces of the electro-optic materials 12, 25 and 26 and on surfaces of the beam splitters 16 and 28.

In the above-described first and second embodiments of the voltage detector, the electro-optic materials 12, 25 and 26 may be either of a uniaxial crystal or an isotropic crystal.

The first and second embodiments of the voltage detector have been described with the premise that, when the two return light beams after reflection are caused to interfere with each other in the beam splitter 16 or 28, traveling directions of the two return light beams in the interference operation are completely coincided with each other. If, on the other hand, the traveling directions of the two return light beams are slightly shifted from each other, the output light beam provided as a result of the optical interference shows interference fringes spatially. When the relative optical path difference of the two return light beams is changed by the voltage applied to the electro-optic material 12 or to the electro-optic materials 25 and 26, the interference fringes moves so that the dark and light interference pattern is inverted in brightness. Thus, in the case where the traveling directions of the two return light beams are slightly shifted from each other, similarly as in the case where the traveling directions of the two return light beams are completely coincided with each other, the voltage developing in the selected area of the object under test can be measured by detecting the movement of the interference fringes, that is, the change in brightness of the dark and light interference pattern.

In the voltage detector of the invention, by using a CW light source as the light source 53 and a fast response detector such as a streak camera as the detector 19 and measuring high-speed voltage variation of the object under test with high time resolution, the higher-speed variation of voltage can be detected with high accuracy.

Figure 4:
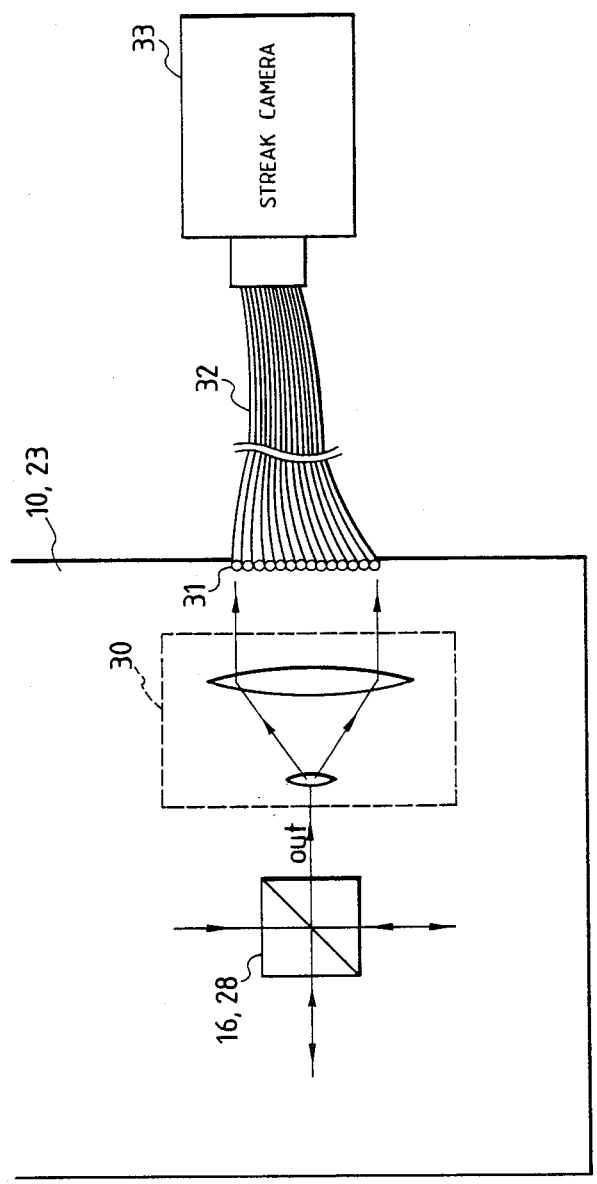
FIG. 4 is an explanatory diagram showing the arrangement of a part of a voltage detector according to the invention which employs a streak camera as its detector.

FIG. 4 shows the arrangement of a part of a voltage detector according to the invention, which employs a streak camera 33. As shown in FIG. 4, the output light beam OUT provided as a result of the interference of the two reflected light beams in the beam splitter 16 (or 28) in the optical probe 10 (or 23) is expanded by an expanding optical system 30 such as a beam expander, so that parallel rays of light are made incident on a light-receiving surface 31 provided on the side wall of the optical probe 10 (or 23) and applied to the streak camera 33 through a bundle of optical fibers 32.

Figure 5:
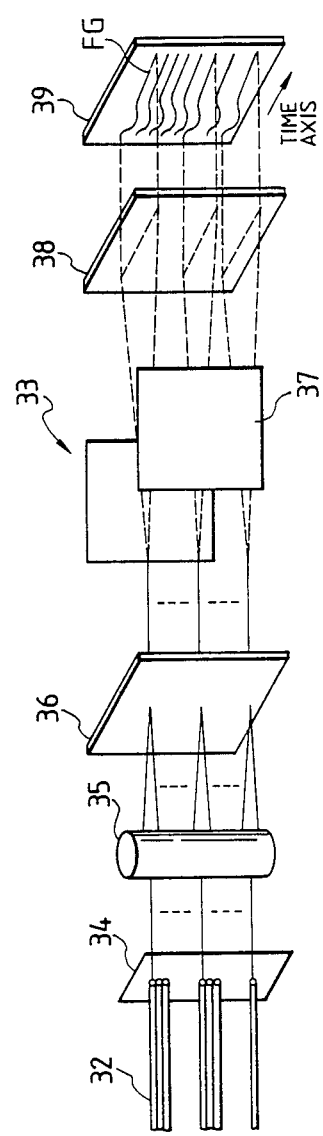
FIG. 5 is an explanatory diagram outlining the arrangement of a streak camera.
Figure 6:
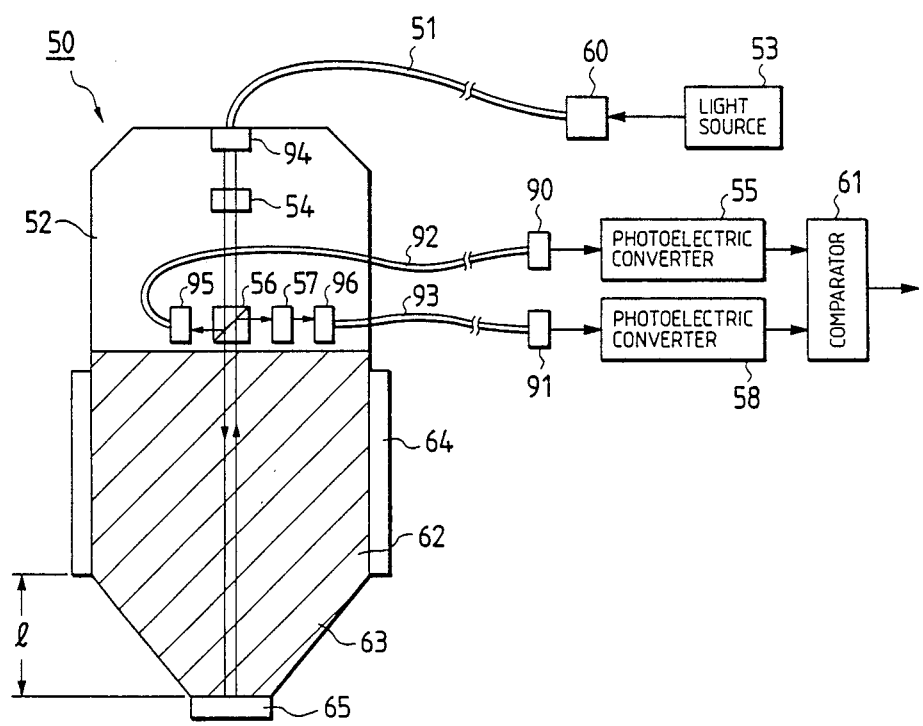
FIG. 6 is an explanatory diagram showing the arrangement of a voltage detector having been proposed in Japanese Patent Application No. 137317/1987.

The streak camera 33, as shown in FIG. 5, comprises: a slit 34 in which ends of the optical fibers of the bundle 32 are arranged in a line; a lens 35 to which the rays of light passed through the optical fibers 32 thus arranged are applied through the slit 34; a photocathode 36 to which the rays of light focused by the lens 35 are applied in a line, thus providing electron beams arranged in a line; a pair of deflection electrodes 37 for deflecting the electron beams horizontally; a microchannel plate 38 for multiplying the electron beams thus deflected; and a phosphor screen 39 to which the output electron beams of the microchannel plate 38 are applied. In FIG. 5, the microchannel plate 38 and the phosphor screen 39 are shown separated for convenience in description; however, in practice, they are joined together forming one unit. Furthermore, the lens 35 is shown cylindrical; however, generally it is not cylindrical.

With the voltage detector having the streak camera, the observation may be made with the traveling directions of the light beams in the interference operation coincided with each other similarly as in the above-described case, or it may be carried out as follows: The traveling directions of the light beams are slightly shifted from each other, and the interference fringes are expanded with the expanding optical system 30, and a linear part of the resultant expanded interference fringes is extracted with the slit 34 of the streak camera for observation.

It is rather difficult to maintain the light-traveling directions coincided with each other with high accuracy. However, if the interference fringes are observed as a streak image FG with the streak camera, then even if the light-traveling directions are slightly shifted from each other the observation will not be adversely affected thereby; that is, the observation can be achieved with high accuracy being free from measurement errors which otherwise may be caused by the deviation in position of optical system for instance due to vibration.

In the above-described embodiment, the streak camera 33 is employed. However, the same effect may be obtained by the following method: A pulse light source such as a laser diode which emits light pulse with extremely short pulse width in synchronism with the voltage under measurement, may be employed as the light source 53, and a photoelectric converter may be used as the detector, so that the high-speed voltage change of the object is sampled with an extremely short period. The light pulse width emitted from the laser diode ranges from several psec to 100 psec. If a CPM dye laser is employed, the light pulse with the width of approximately 0.1 psec can be utilized.

It is preferable to paint an inner surface of the optical probe 10 or 23 black except for the parts through which the light beams pass, thereby to prevent the scattering of light.

As was described above, in the voltage detector of the invention, the light beam from the light source is split into the light beam advancing along the reference light path and the light beam advancing along the light path extended to the optical path length changing means, and the return light beams from these optical paths after reflection are caused to interfere with each other to provide the output light beam, which is applied to the detection means for detecting the intensity thereof. Therefore, the utilization efficiency of the light beam emitted from the light source is increased and the optical system can be simplified; especially the means for guiding the output light beam to the detection means can be one optical fiber. Thus, the voltage in the selected area of the object under test can be detected by the detector with high accuracy.

What is claimed is:

1. A voltage detector for detecting a voltage developing in a selected area of an object to be measured, comprising:
   a light source for emitting a light beam;
   a first optical path including first reflection means and a first electro-optic material for sensing said voltage developing in said object as a change in a refractive index thereof;
   a second optical path including second reflection means;
   splitting means for splitting said light beam introduced from said light source into a first light beam going along said first optical path and a second light beam going along said second optical path, causing return first and second light beams reflected from said respective first and second reflection means to interfere with each other, and extracting an output interference light beam; and
   detection means for determining said voltage developing in said selected area of said object on the basis of intensity of said received output interference light beam.

2. A voltage detector as claimed in claim 1, wherein said second reflection means is movable in a direction parallel to said second optical path.

3. A voltage detector as claimed in claim 1, wherein said second optical path further includes a second electro-optic material for sensing said voltage in said object as a change in a refractive index thereof, and said changes in said refractive indices of said first and second electro-optic materials are opposite to each other.

4. A voltage detector as claimed in claim 3, wherein said second optical path further includes a reflection mirror disposed between said splitting means and said second electro-optic material.

5. A voltage detector as claimed in claim 1, wherein traveling directions of said return first and second light beams under interference operation in said splitting means are slightly shifted from each other, said splitting means extracts said output light beam having spatial interference fringes, and said detection means detects a change in brightness of a dark and light interference pattern.

6. A voltage detector as claimed in claim 1, wherein said light source is a CW light source; and
   said detection means is a fast response detector; and said voltage detector further comprising:
   an expanding optical system for expanding said output light beam to parallel light beams; and
   guide means for introducing said parallel light beams to said fast response detector.

7. A voltage detector as claimed in claim 6, wherein said fast response detector is a streak camera.

8. A voltage detector as claimed in claim 6, wherein said guide means is a bundle of optical fibers; and
   said expanded output light beams are applied to a photocathode of said streak camera through said bundle of optical fibers and a slit in which ends of said bundle of optical fibers are arranged in a line.

9. A voltage detector as claimed in claim 6, wherein traveling directions of said return first and second light beams under interference operation in said splitting means are slightly shifted from each other, said splitting means extracts said output light beam having spatial interference fringes, and said streak camera detects a change in brightness of a dark and light interference pattern.

10. A voltage detector as claimed in claim 1, wherein said light source is a pulse light source for emitting a pulse light beam with extremely short pulse width in synchronism with said voltage in said object; and
    said detection means is a photoelectric converter.

* * * * *